(12) United States Patent (10) Patent No.: US 6,940,630 B2
Xie (45) Date of Patent: Sep. 6, 2005

(54) VERTICAL DISPLACEMENT DEVICE

(75) Inventor: Huikai Xie, Gainesville, FL (US)

(73) Assignee: University of Florida Research Foundation, Inc., Gainesville, FL (US)

( * ) Notice: Subject to any disclaimer, the term of this patent is extended or adjusted under 35 U.S.C. 154(b) by 0 days.

(21) Appl. No.: 10/835,344

(22) Filed: Apr. 29, 2004

(65) Prior Publication Data

US 2004/0218877 A1 Nov. 4, 2004

Related U.S. Application Data

(60) Provisional application No. 60/467,225, filed on May 1, 2003.

(51) Int. Cl.[7] .............................................. G02B 26/00
(52) U.S. Cl. ...................... 359/290; 359/254
(58) Field of Search ................. 359/237, 290, 359/291, 254, 298

(56) References Cited

U.S. PATENT DOCUMENTS

| | | | | |
|---|---|---|---|---|
| 6,025,951 | A | * | 2/2000 | Swart et al. ................. 359/245 |
| 6,220,561 | B1 | * | 4/2001 | Garcia .......................... 248/487 |
| 6,759,787 | B2 | * | 7/2004 | Miller et al. ................. 310/309 |
| 2002/0015215 | A1 | * | 2/2002 | Miles ........................... 359/290 |

* cited by examiner

*Primary Examiner*—Andrew H. Lee
(74) *Attorney, Agent, or Firm*—Akerman Senterfitt; Gregory A. Nelson; Michael K. Dixon

(57) ABSTRACT

A MEMS vertical displacement device capable of moving one or more vertically displaceable platforms relative to a base. In particular, the vertical displacement device may be capable of moving a vertically displaceable platform so that the vertically displaceable platform remains generally parallel to a base. The vertically displaceable platform may be, but is not limited to, a microlens, a micromirror, micrograting, or other device. The vertical displacement device may also be included in optical coherence and confocal imaging systems.

15 Claims, 9 Drawing Sheets

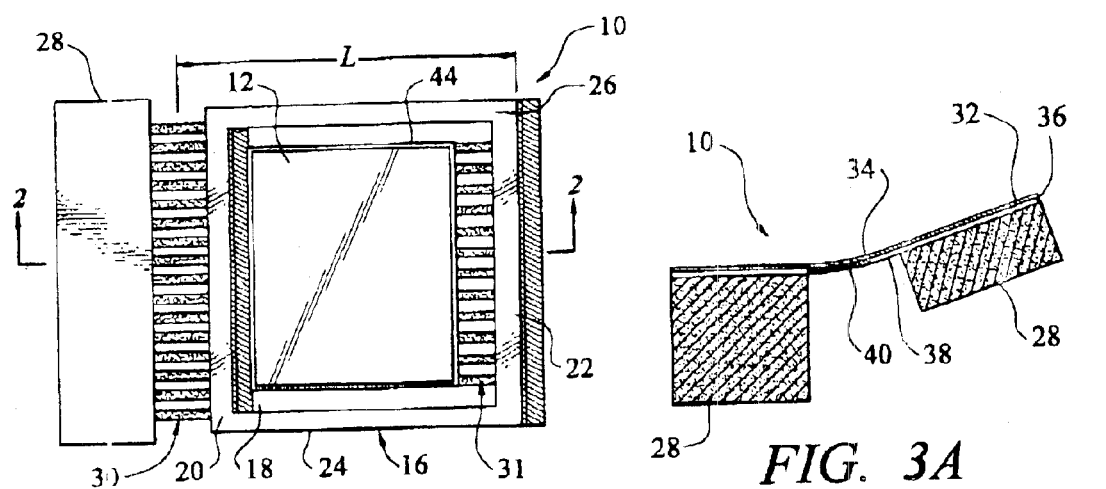
FIG. 1
FIG. 3A
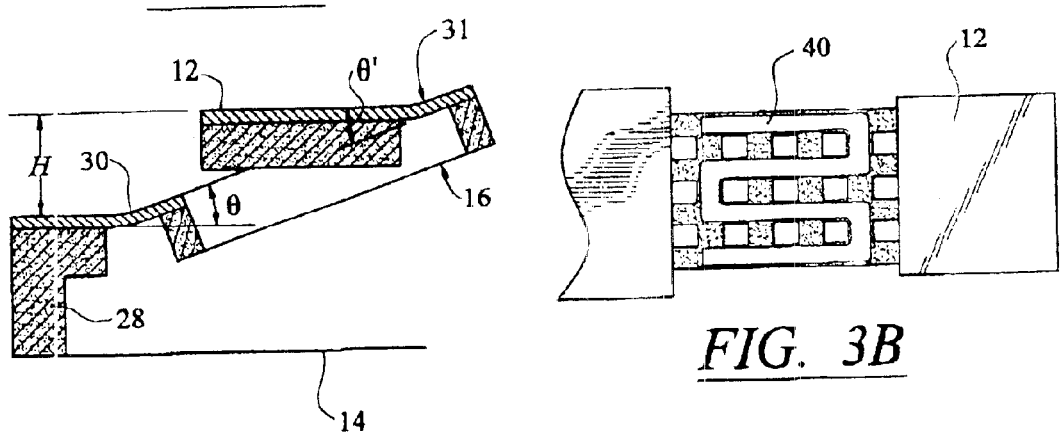
FIG. 2
FIG. 3B

VERTICAL DISPLACEMENT DEVICE

CROSS-REFERENCE TO RELATED APPLICATION

This application claims the benefit of U.S. Provisional Application No. 60/467,225, filed May 1, 2003.

FIELD OF THE INVENTION

This invention is directed generally to vertical displacement devices, and more particularly to microelectromechanical vertical displacement devices and use of these devices in biomedical applications.

BACKGROUND

Microelectromechanical system (MEMS) devices are devices that operate on a very small scale, typically in a range of tens of microns to a few millimeters. MEMS devices mostly are fabricated using integrated circuits (IC) technology. Production of MEMs devices, likewise, enables one to realize relatively low manufacturing costs because of the batch fabrication techniques and the small size of the devices. In some applications MEMS devices are imperceptible to the unaided human eye. MEMS devices include many different devices used for a variety of purposes. One device in particular is a movable micromirror having the capability of rotating about a pivot point or an axis. One end of the micromirror is coupled to an anchor, which may be a substrate, using a bimorph actuator that may be activated by sending an electrical current to a heating element in the actuator. The current causes the temperature of the actuator in the micromirror to increase, which in turn causes the actuator to bend. While the micromirror may be rotated about a pivot point, the micromirror may not be translated to another position. Instead, the micromirror is fixedly attached to the anchor.

Numerous actuation devices have been used with MEMS devices to achieve vertical displacement. For instance, displacements of between about 7.5 $\mu$m and about 50 $\mu$m have been achieved through the use of electrostatic vertical comb drives. In addition, electrostatic and electromagnetic actuators have generated displacements of about 6 $\mu$m and about 20 $\mu$m. However, the displacements of most displacement devices have been limited to these ranges. Thus, a need exists for larger amounts of vertical displacement within MEMS devices.

Many applications exist in which a micromirror having the ability to be moved relative to a Z-axis could be used rather than simply pivoting about an anchor. For instance, axial scanning of an optical coherence tomography (OCT) imaging system requires translational mirrors capable of moving out-of-plane along a z-axis. OCT is an imaging technology that can be used to obtain cross-sectional imaging of biological tissues for noninvasive or minimally invasive medical diagnosis. OCT is based on low coherence interferometery and fiber optic technology, and has very high spatial resolution (<10 $\mu$m). OCT has been successfully used to detect various cancers.

Another application that could benefit from a micromirror or microlens movable along a Z-axis is optical coherence microscopy (OCM). OCM has been used to obtain cross-sectional information of biological or biomedical tissues, which is the same as OCT, and is based on low coherence interferometry. However, OCM differs from OCT in that OCM produces higher lateral resolution because it uses a sharply focused laser beam, which in some applications may be about 1 $\mu$m. In contrast, OCT requires 1–3 mm focus depth, which limits the laser spot size to about 10 $\mu$m. Currently, axial scanning of a reference mirror is accomplished using Plumbum (lead) Zirconate Titanate (PZT) actuators and relies on motorized stages to perform z-scanning and x-y scanning. As a result, the current OCM devices are bulky and slow. Thus, a need exists for a more compact and more time efficient device for enabling z-scanning and x-y scanning.

SUMMARY OF THE INVENTION

This invention relates to a vertical displacement device capable of raising one or more vertically displaceable platforms relative to a base. In particular, the vertical displacement device may be capable of raising a vertically displaceable platform so that the vertically displaceable platform remains generally parallel to a base. In at least one embodiment, the vertical displacement device may be a MEMS device. The vertically displaceable platform may be, but is not limited to, a microlens, a micromirror, or other device.

The vertical displacement device may be formed from one or more frames rotatably coupled to an anchor. In at least one embodiment, a first member of the frame is coupled to an anchor with one or more piston-motion thermal actuators. The thermal actuator may be configured so that when a current is applied to the actuator, the actuator bends. Thus, when a current is applied to the thermal actuator coupling the frame to the anchor, the thermal actuator causes the frame to rotate about the anchor. A vertically displaceable platform may be coupled to a second member of the frame that is generally opposite to the first member using one or more thermal actuators. The vertically displaceable platform may be configured to fit into a cavity formed by the frame.

In another embodiment, which is capable of performing 2-D scanning, a second frame may be coupled to the second side of the frame using one or more thermal actuators and may be sized to fit in the cavity of the frame. A third frame may be coupled to any side of the second frame using a thermal actuator. A vertically displaceable platform may be coupled to the third frame on a side of the third frame that is generally opposite to a side of the frame to which the second frame is coupled. This embodiment enables 2-D scanning to be performed using the vertical displacement device.

The vertical displacement device may raise a vertically displaceable platform by sending a current to the thermal actuators. The current causes the temperature of thermal actuators to increase and bend. The bending action causes the frame to rotate about the anchor in a first direction and causes the vertically displaceable platform to rotate about the second member of the frame in a second direction that is generally opposite to the first direction when viewed from the same perspective. The vertical displacement device may operate in modes where the tilt of the vertical displacement device relative to the frame is equal to the tilt of the frame relative to a base, which equates to the vertically displaceable platform being moved along the z-axis and the frame to be placed generally orthogonal to the Z-axis. The vertical displacement device may also operate in modes where the tilt of the vertical displacement device and the tilt of the frame are not equal, which results in the vertically displaceable platform being tilted relative to the Z-axis and not positioned in a plane orthogonal to the Z-axis.

The large vertical displacement (~1 mm) may be achieved because the platform is located at the tip of a rotating arm.

Thus, even small changes in an angle may result in a large tip displacement. The rotational motion may be converted to translational vertical motion by using a counter-tilt frame. The counter-tilt frame also enables the vertically displaceable platform to be raised from a surface without tilting the platform. The large vertical displacement achievable by the platform is large relative to microelectromechanical systems.

The vertical displacement device may be used in numerous embodiments such as, but not limited to, wave-front shaping in adaptive optics, biomedical imaging, interferometry systems, laser beam scanning, and spatial light modulators. For example, the vertical displacement device may be used as a part of a MEMS based OCT system. In at least one embodiment, the MEMS based OCT system may be used for early lung cancer detection. In another embodiment, the vertical displacement device may be used as a part of a MEMS based OCM system. These and other embodiments are described in more detail below.

BRIEF DESCRIPTION OF THE DRAWINGS

The accompanying drawings, which are incorporated in and form a part of the specification, illustrate embodiments of the presently disclosed invention and, together with the description, disclose the principles of the invention.

FIG. 1 is a top view of an exemplary vertical displacement device according to one or more aspects of this invention.

FIG. 2 is a cross-sectional view of the vertical displacement device shown in FIG. 1.

FIG. 3A is a cross-sectional view of an exemplary vertical displacement device according to one or more aspects of this invention and is a basic structure of a 1D mirror.

FIG. 3B is a top view of the vertical displacement device shown in FIG. 3A.

DETAILED DESCRIPTION OF THE INVENTION

Figure 4A:
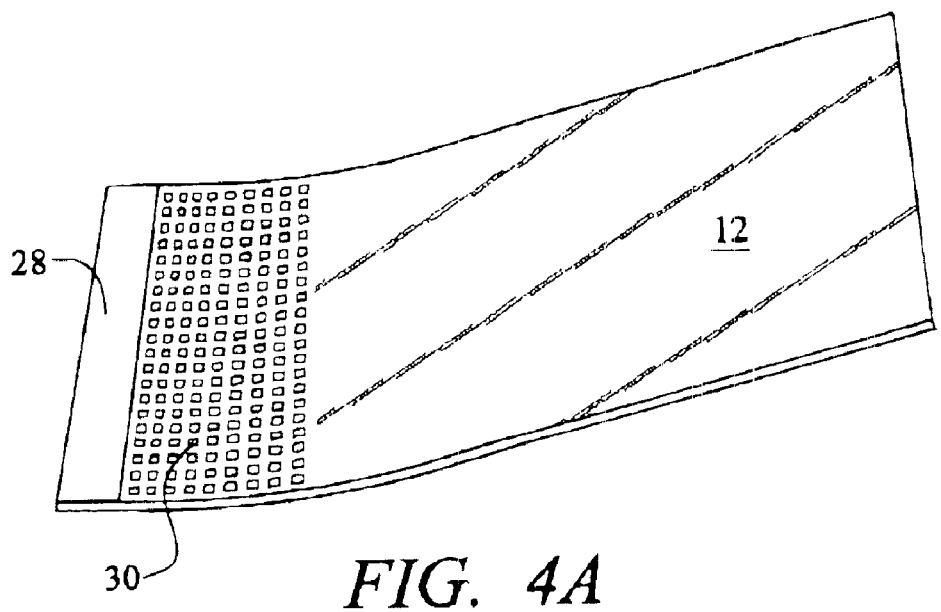
FIG. 4A is a perspective view of a vertical displacement device according to aspects of this invention.

As shown in FIGS. 1–18, this invention is directed to a vertical displacement device 10, which may be referred to as a large vertical displacement device (LVD), capable of raising one or more vertically displaceable platforms 12 along a Z-axis relative to a base 14. In particular, vertical displacement device 10 may be capable of raising vertically displaceable platform 12 along a Z-axis so that vertically displaceable platform 12 remains generally parallel to base 14. Generally, the vertical displacement device 10 lies in a single plane while in an unactuated position. The vertical displacement device 10 may be moved along the Z-axis by actuating at least two thermal actuators using an electrical current. In at least one embodiment, vertical displacement device 10 is a microelectromechanical (MEMS) device that is capable of functioning on a small scale. Vertically displaceable platform 12 may be, but is not limited to, a microlens, a micromirror, a micro-grating, or other device.

Vertical displacement device 10, as shown in FIGS. 1 and 2, may be formed from one or more frames 16. In at least one embodiment, frame 16 may be formed in a generally rectangular shape forming a cavity 18, which may be referred to as a trench, for containing vertically displaceable platform 12. However, frame 16 is not limited to having this shape. Rather, frame 16 may have any shape enabling vertically displaceable platform 12 to move relative to base 14. In the embodiment shown in FIG. 1, cavity 18 has a generally square shape. Frame 16 may be formed from a first member 20 and an opposing second member 22. In at least one embodiment, frame 16 may be substantially square and may be formed from first member 20 and opposing member 22 coupled together by a third member 24 and a fourth member 26.

Frame 16 may be configured to rotate about an anchor 28. Anchor 28 may or may not be an integral part of base 14. Frame 16 may be coupled to anchor 28 using one or more thermal actuators 30. In at least one embodiment, thermal actuator 30 may be, but is not limited to, a bimorph actuator. Thermal actuator 30 may be a thin-film structure and may undergo significant bending when heated, as shown in FIGS. 3A–5D.

Figure 4B:
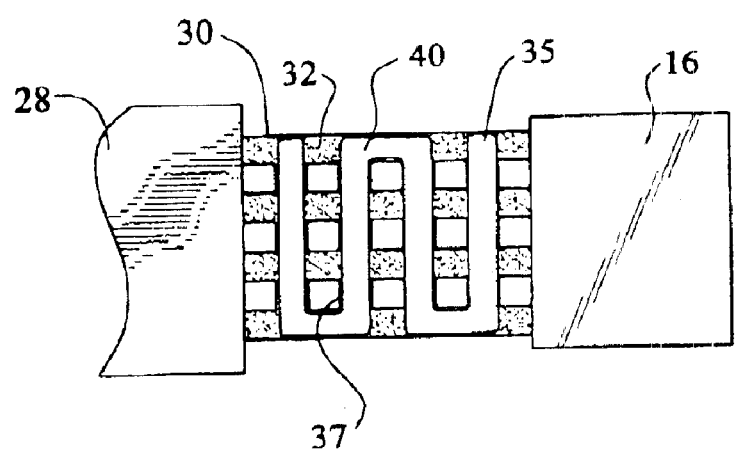
FIG. 4B is a top view of an alternative thermal actuator usable with this invention.
Figure 4C:
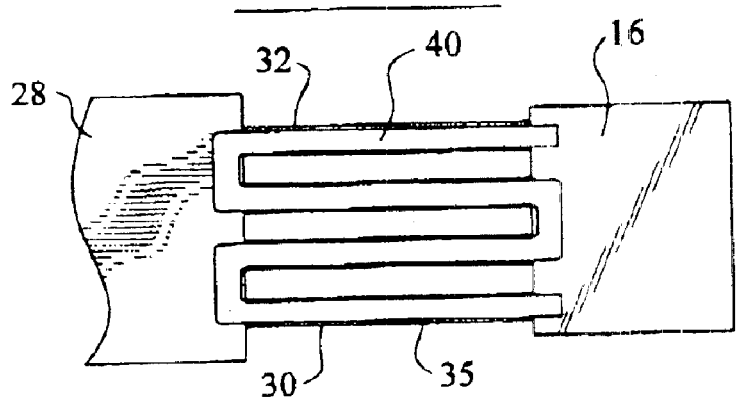
FIG. 4C is a top view of an alternative thermal actuator usable with this invention.

Thermal actuator 30 may be formed from two or more materials having different thermal expansion coefficients. A first material 32 may form a top surface 34 of thermal actuator 30, and a second material 36 may form a bottom surface 38. In at least one embodiment, first material 32 may be a metal, such as, but not limited to, aluminum, and second material 36 may be a dielectric, such as, but not limited to, silicon dioxide, an oxide, or other material. In at least one embodiment, the second material 36 may be formed into a mesh, as shown in FIG. 4A, having generally longitudinal and latitudinal members, 35 and 37 respectively, and the first material 32 may be coupled generally to the longitudinal members 35 of the second material 36. In other embodiments, the first material 32 may be coupled generally to the latitudinal members 37, as shown in FIG. 4B. In yet another embodiment, the second material 36 may include only longitudinal members 35, and the first material 32 may be coupled to the longitudinal members 35 of the second material 36, as shown in FIG. 4C.

As shown in FIG. 2, both thermal actuators 30 and 31 curl. Thus, the frame 16 coupled to thermal actuator 30 forms an initial tilt angle θ with respect to base 14, and the platform 12 coupled to thermal actuator 31 forms the same initial tilt angle θ with respect to frame 16. As a result, vertically displaceable platform 12 is parallel to base 14.

As the thermal actuator 30, 31 is heated, a first end of the thermal actuator 30 or 31 bends up or down. If the second material 36 expands at a greater rate than the first material 32, then the thermal actuator 30 or 31 bends about the first material 32, or upwards. If the first material 36 expands at a greater rate than the second material 36, then the thermal actuator 30 or 31 bends about the second material 36, or downwards. In one embodiment, the first material 32 expands at a greater rate than the second material 36. In other words, the thermal expansion coefficient of the first material 32 is greater than that of the second material 36). When heated simultaneously, thermal actuators 30 and 31 both bend downwards and thus, platform 12 stays parallel to base 14. Therefore, large vertical displacement (LVD) is achieved by converting the large tip displacement of a rotating frame 16 into vertical displacement of the platform 12. The vertical displacement may be determined by multiplying the length L of frame 16 by 2 sin θ. For example, where L equals 2 mm, and the initial tilt angle θ equals 30°, the vertical displacement is about 1 mm. The initial tilt angle θ is due to the residual stress and thermal expansion coefficient difference of the first material 32 and second material 36.

Thermal actuator 30 may also include a third material 40 encapsulated in second material 36. Third material 40 may be, but is not limited to, polysilicon. Third material 40 may act as a heating element in thermal actuator 30. In at least one embodiment, third material 40 may have a resistance of about 2.4 kΩ and may carry a maximum current of about 18 mA before thermal damage occurs.

Figure 6:
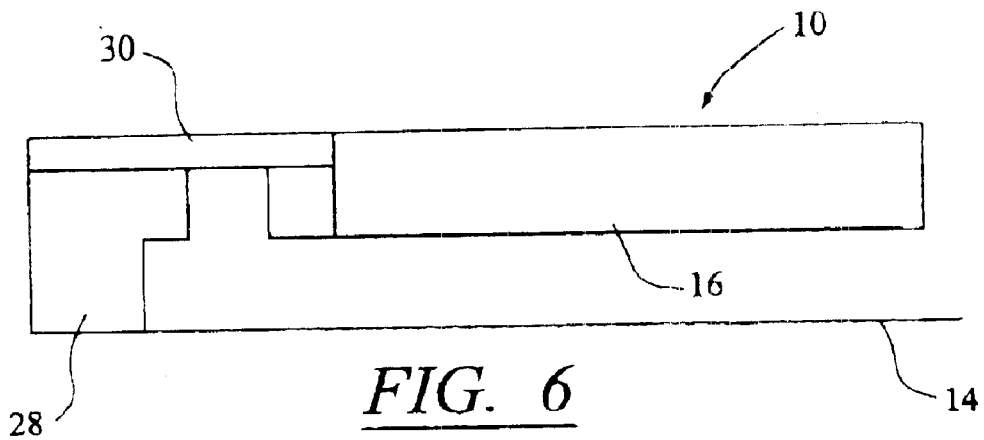
FIG. 6 is a side view of a vertical displacement device in an unactuated condition.

Vertically displaceable platform 12 may be coupled to frame 16 so that vertical displacement device 12 can rotate relative to frame 16. In at least one embodiment, vertically displaceable platform 12 may be coupled to second member 22 of frame 16 with a thermal actuator 31. In this embodiment, vertically displaceable platform 12 is coupled to second member 22 so that vertically displaceable platform 12 is positioned in cavity 18 while vertical displacement device 10 is in an unactuated position, as shown in FIG. 6.

Figure 7:
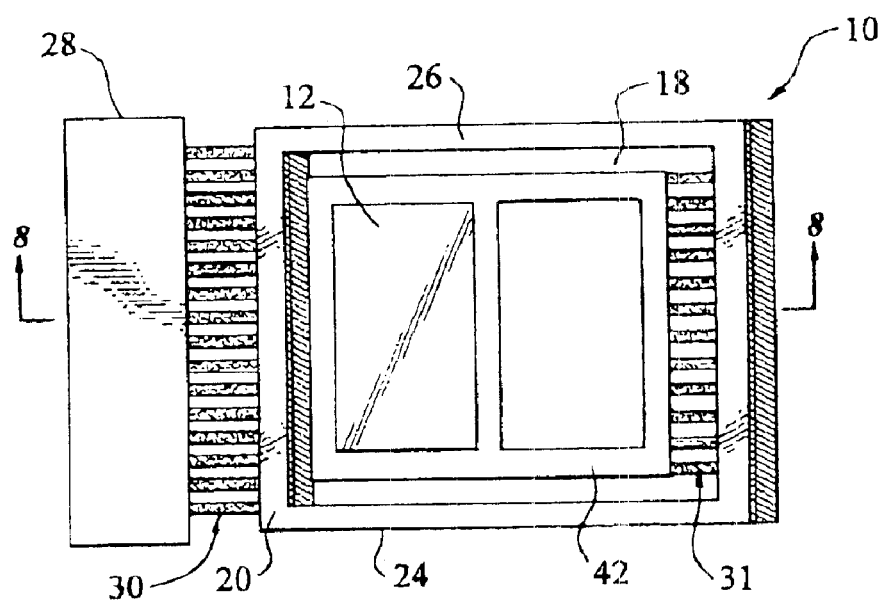
FIG. 7 is a top view of a vertical displacement device having one or more; extension arms.
Figure 8:
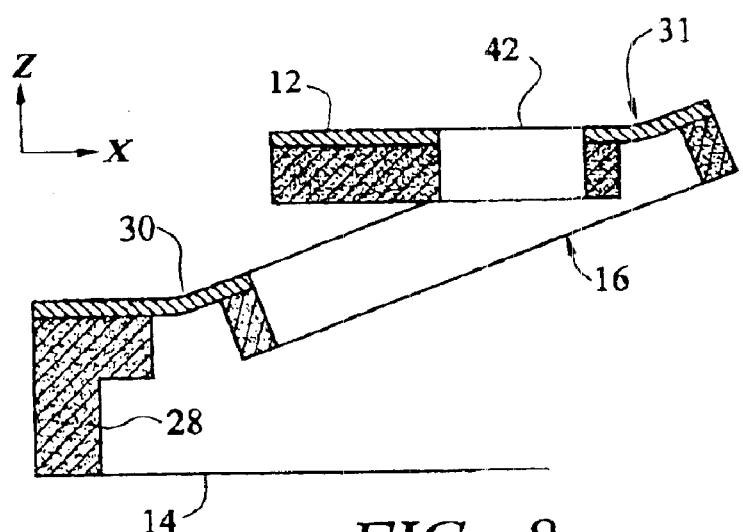
FIG. 8 is a side view of the vertical displacement device shown in FIG. 7.

In one embodiment, as shown in FIGS. 7 and 8, vertical displacement device 10 may include one or more extension arms 42 for supporting vertically displaceable platform 12. Extension arm 42 may be coupled to frame 16 using one or more thermal actuators 31. In the embodiment shown in FIGS. 7 and 8, extension arm 42 may be sized and configured to fit in cavity 18; however, extension arm 42 may extend outside cavity 18 for at least some applications. In addition, FIGS. 7 and 8 depict use of two extension arms 42; however, vertical displacement device 10 is not limited to this number of extension arms 42 but may have one or more extension arms 42. Extension arms 42 enable the displacement of vertically displaceable platform 12 to be increased without having to increase the dimensions of vertically displaceable platform 12. The extension arm 42 enables the vertically displaceable platform 12 to be moved a substantial distance relative to the size of the device 10 and conventional systems.

As previously mentioned, vertically displaceable platform 12 may include a micromirror 44, as shown in FIG. 1. Micromirror 44 and all other LVD devices discussed may be fabricated using a deep reactive-ion-etch (DRIE) complementary metal oxide semiconductor (CMOS)—MEMS process, as shown in FIGS. 5A–5D, which is described in detail at "Post—CMOS Processing for High-Aspect-Ratio Integrated Silicon Microstructures" by H. Xie, L. Erdmann, X. Zhu, K. Gabriel, and G. Fedder in the *Journal of Microelectromechanical Systems*, 11 (2002) 93–101. The process flow, as shown in FIGS. 5A–5D, starts with CMOS chips from a foundry CMOS process and includes a poly-Si layer 100 forming a SCS membrane, a metal-1 layer 102, a metal-2 layer 104, and a metal-3 layer 106. The CMOS starting chips or wafers can be made from standard thin-film deposition and lithography processes.

Figure 5A:
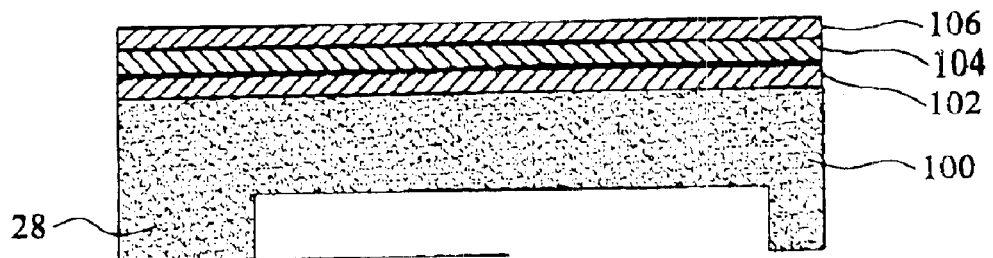
FIGS. 5A–D illustrate a four step process of forming a vertical displacement device of the instant invention.
Figure 5B:
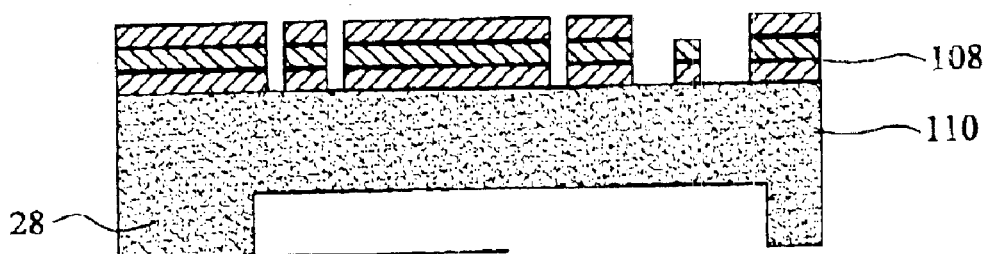
Figure 5C:
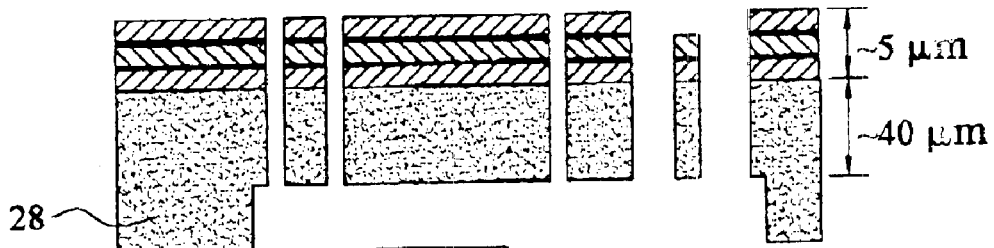
Figure 5D:
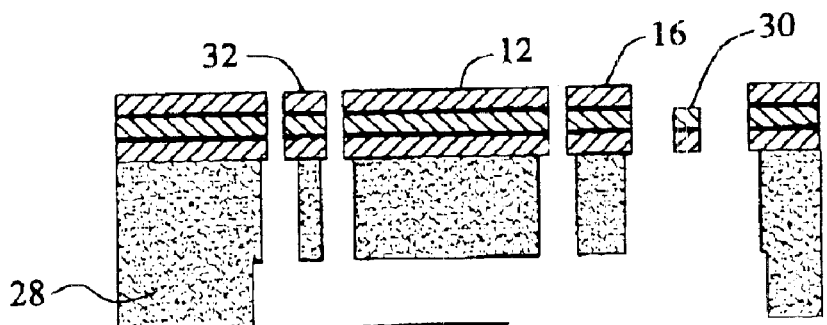

The backside silicon DRIE step, as shown in FIG. 5A, leaves a 10 μm to 100 μm-thick structural single-crystal silicon (SCS) membrane. The SCS membrane keeps the platform 12 flat. This step controls the thickness of the microstructure and forms a cavity that allows the microstructure to move freely. The depth of the cavity may be determined by the thickness of the CMOS chips. Next, an anisotropic dielectric etch is performed from the front side, as shown in FIG. 5B, followed by DRIE of silicon, as shown in FIG. 5C. There exists an oxide layer 108 that may be about 5 μm thick and a silicon substrate 110 that may be about 40 μm thick, as shown in FIGS. 5B and 5C. At the end of this step, a thick SCS layer remains underneath the CMOS layer, resulting in a flat released microstructure. Finally, a brief isotropic silicon etch is performed, as shown in FIG. 5D. Any beam produced with a half-width less than the silicon undercut may not have a SCS layer underneath the beam. This type of beam may be used to form electrically isolated SCS islands, purposefully curled-up structures or z-compliant springs.

This post-CMOS micromachining may require only four dry etch steps and is compatible with foundry CMOS electronics. This process does not produce a substrate or thin-film layer directly above or below the micromirror 44 structure. Thus, there are no mechanical limits to the actuation range. Micromirror 44 may be a SCS backing layer that may be about 40 μm thick and provide good flatness across the surface of micromirror 44.

Figure 9:
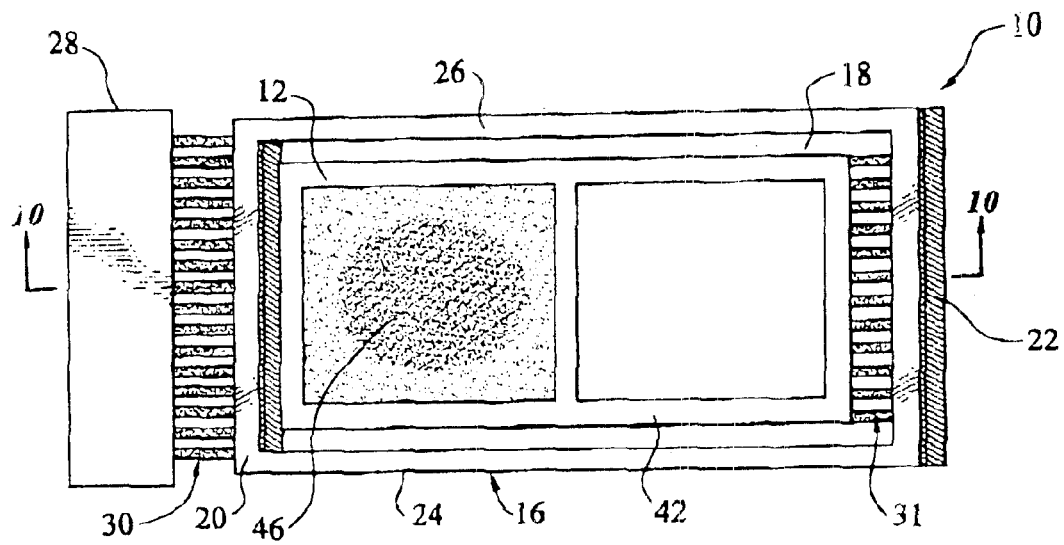
FIG. 9 is a top view of a vertical displacement device including an attached microlens.
Figure 10:
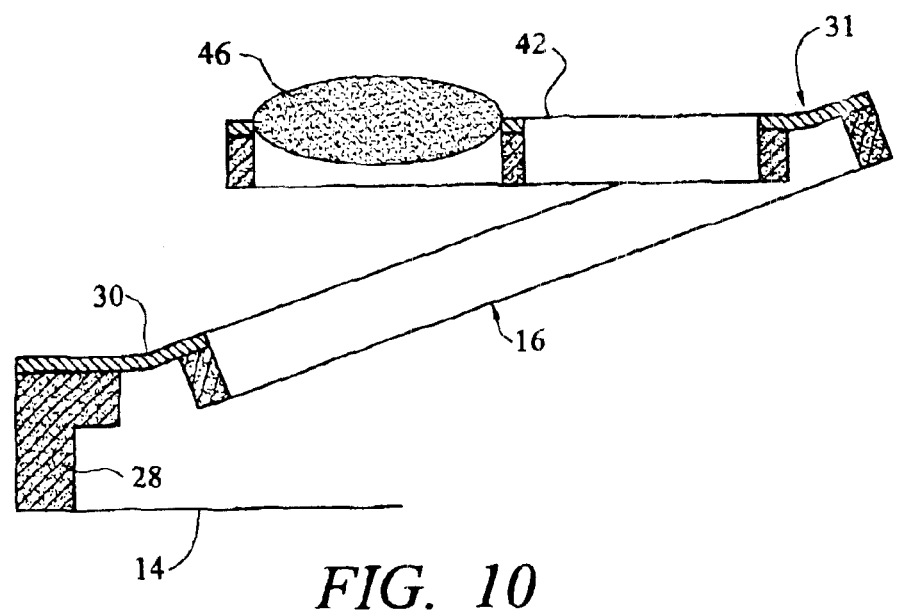
FIG. 10 is a side view of the vertical displacement device shown in FIG. 9.
Figure 11:
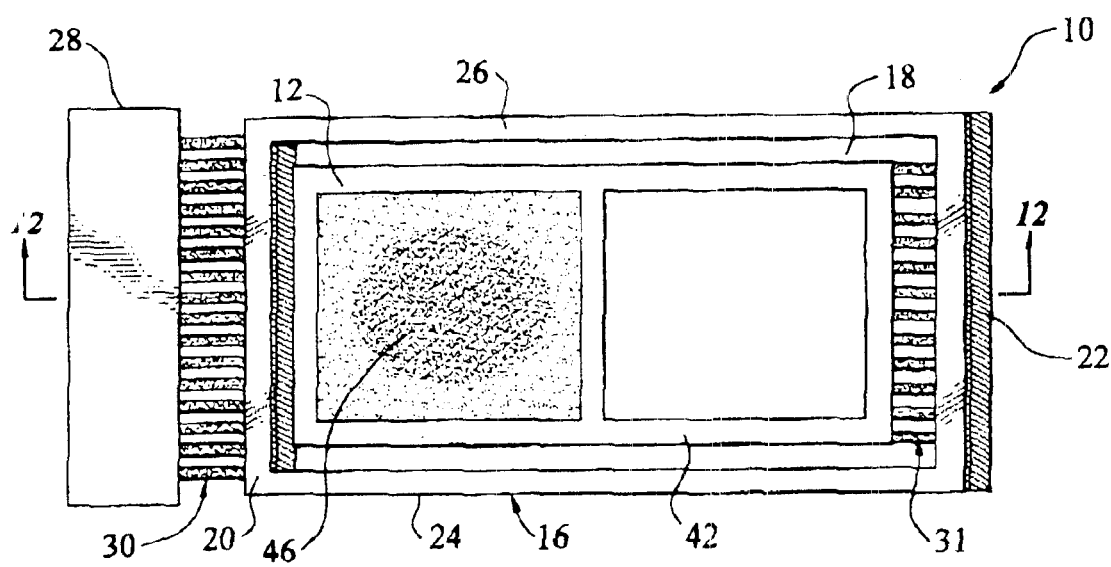
FIG. 11 is a top view of a vertical displacement device including an integrated microlens.
Figure 12:
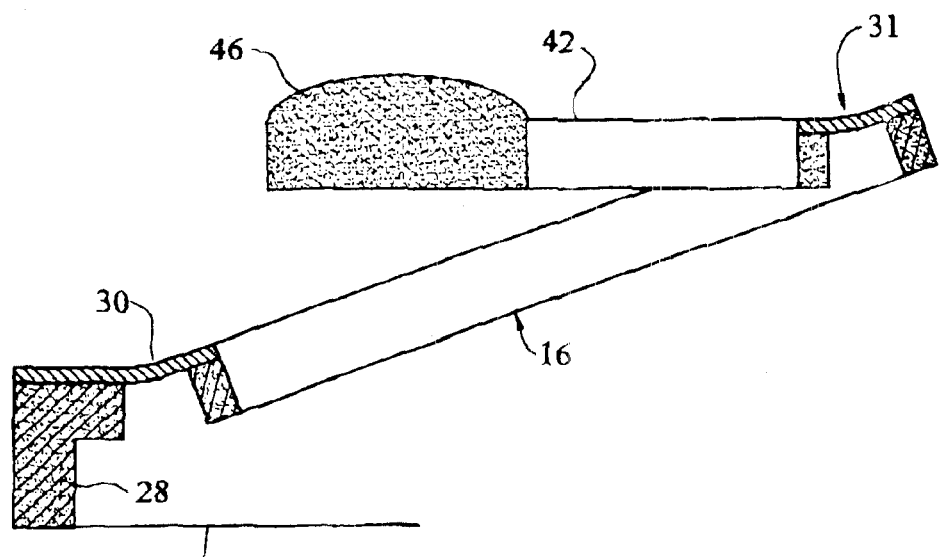
FIG. 12 is a side view of the vertical displacement device shown in FIG. 11.

In other embodiments, vertically displaceable platform 12 may include a microlens 46, as shown in FIGS. 9–12. Microlens 46 may be fabricated from a membrane, such as, but not limited to, a SCS, which is generally transparent to infrared light. Thus, the SCS microlens may be widely used in fiber-optic communications in which infrared lasers, such as, but not limited to, 1.3 μm and 1.55 μm lasers, are the light sources. Microlens 46 may be an attached microlens, as shown in FIGS. 9 and 10, an integrated microlens, as shown in FIGS. 11 and 12, or other devices.

Figure 13:
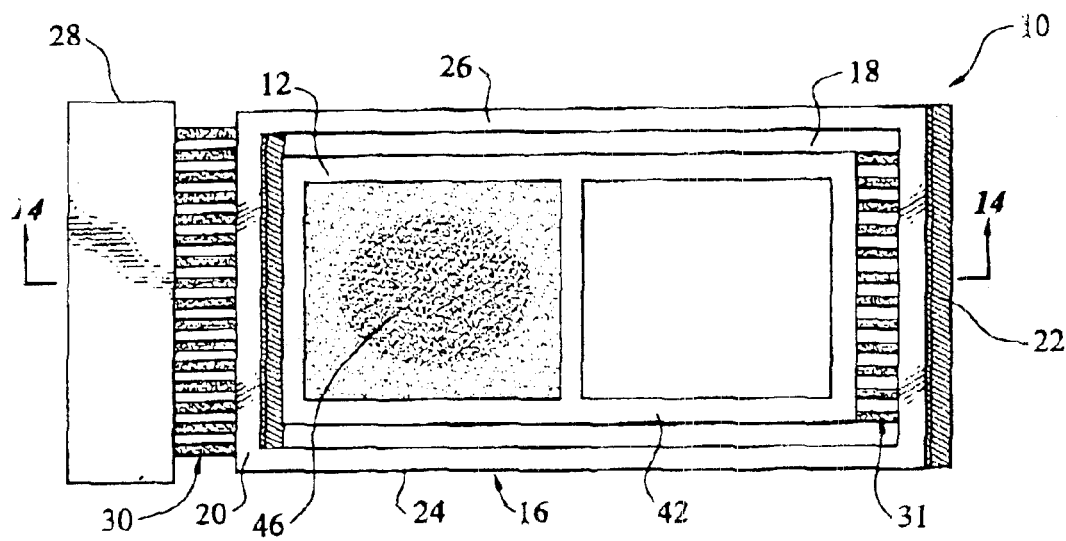
FIG. 13 is a top view of a vertical displacement device including a polymer droplet functioning as a microlens.
Figure 14:
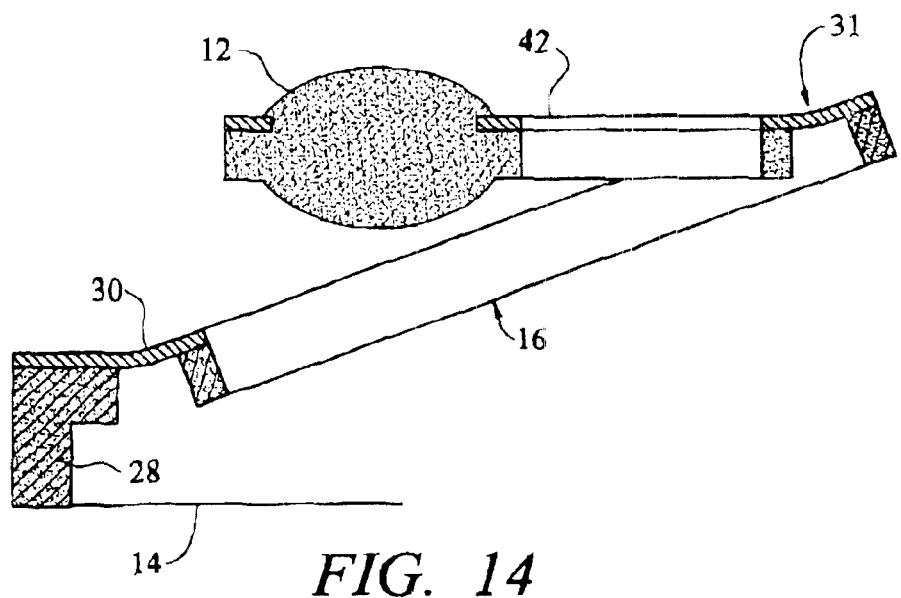
FIG. 14 is a side view of the vertical displacement device shown in FIG. 13.

In yet another embodiment, vertically displaceable platform 12 may include a tunable microlens that may be fabricated by injecting one or more droplets of a polymer material, such as but not limited to, photoresist, onto the hollow platform, as shown in FIGS. 13 and 14. While vertically displaceable platform 12 has been described as including a micromirror, a microlens, and a tunable micrograting, the vertically displaceable platform 12 is not limited to containing only these items. Rather, vertically displaceable platform 12 may include other appropriate items as well.

Figure 15:
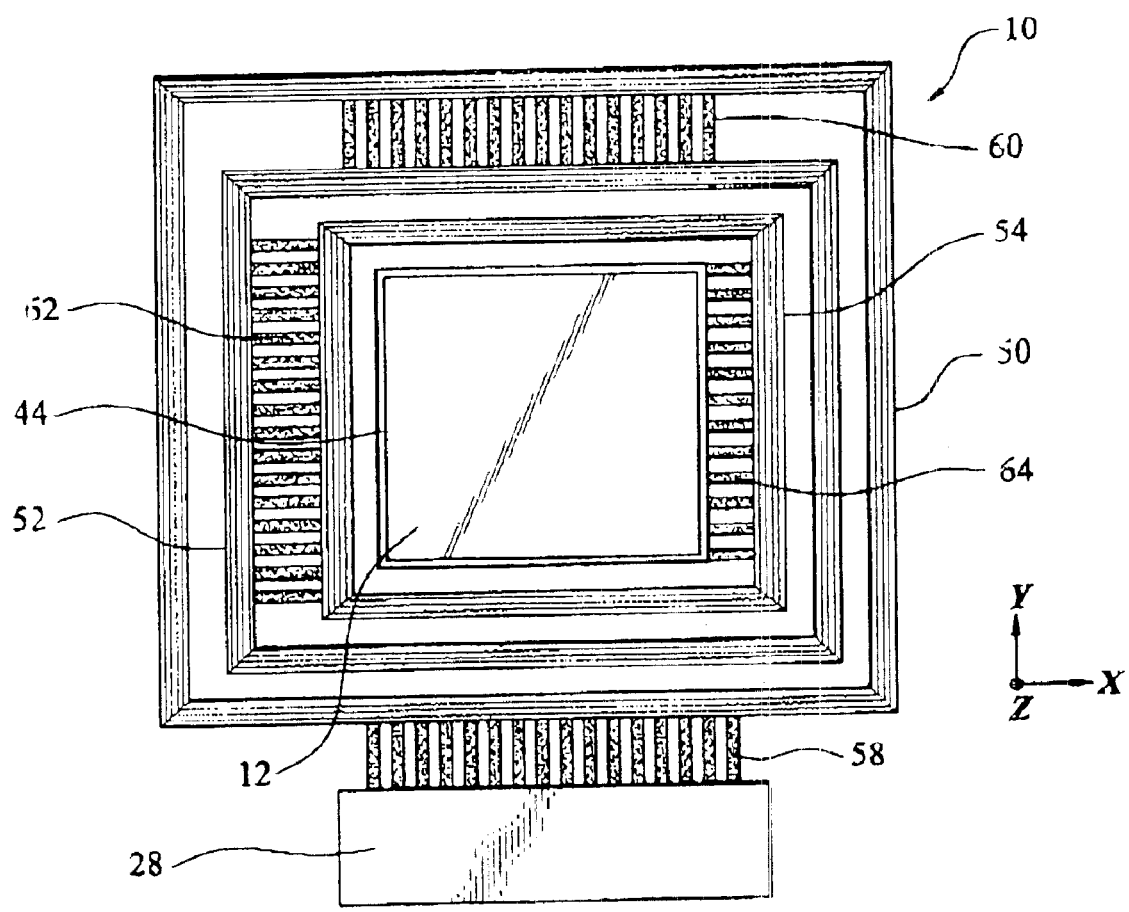
FIG. 15 is a top view of an alternative embodiment of a vertical displacement device with another vertical actuator cascaded orthogonally to extend the vertical displacement range and perform two-dimensional (2D) scanning.

In an alternative embodiment, vertical displacement device 10, as shown in FIG. 15, may include a first frame 50, a second frame 52, and a third frame 54, and may be referred to as a 2-D scanning device. First frame 50 may be coupled to an anchor 56 using one or more thermal actuators 58. Second frame 52 may be coupled to first frame 52 at a side opposite to thermal actuator 58 using one or more thermal actuators 60. This configuration allows second frame 52 to be moved along the Z-axis relative to base 14. Third frame 54 may be coupled to second frame 52 using one or more thermal actuators 62 capable of rotating third frame 54 about second frame 52. Third frame 54 may be coupled to any side of second frame 52. In one embodiment, as shown in FIG. 15, third frame 54 may be coupled to a side of second frame 52 that is generally orthogonal to a side to which thermal actuator 60 is coupled. A vertically displaceable platform 12 may be coupled to third frame 54 using one or more thermal actuators 64. Vertically displaceable platform 12 may be coupled to third frame 54 on a side of third frame 54 opposite to a side to which second frame 52 is attached to third frame 54. Thus, this embodiment has four thermal actuators, 58, 60, 62, and 64. Vertically displaceable platform 12 may be moved along the Z-axis substantially parallel to base 14. Vertically displaceable platform 12 may also be positioned at other positions relative to base 14. In at least one embodiment, third frame 54 may be sized to fit inside second frame 52, and second frame 52 may be sized to fit inside first frame 50.

Vertical displacement device 10 operates in at least five modes. In a first mode, thermal actuator 30 may be heated, which causes frame 16 to rotate in a first direction relative to base 14 while thermal actuator 31 remains unactuated. In a second mode, thermal actuator 31 may be heated, which causes vertically displaceable platform 12 to rotate in a second direction that is generally opposite to the first direction about second member 22 of frame 16 while thermal actuator 30 remains unactuated.

In a third mode, vertical displacement device 10 may move vertically displaceable platform 12 substantially along the Z-axis, as shown in FIG. 2. Vertical displacement device 10, as shown in FIG. 6, lies generally in a single plane while vertical displacement device 10 is in an unactuated position. Vertically displaceable platform 12 may be moved along a Z-axis relative to base 14 by heating thermal actuators 30 and 31 using an electrical current. Heating thermal actuator 30 may cause second material 36 to expand greater than first material 32. As a result, frame 16 may rotate about anchor 28. As frame 16 is rotated about anchor 28, thermal actuator 31 may be heated, which may cause vertically displaceable platform 12 to rotate about frame 16. In one example, thermal actuator 30 may be rotated in a first direction, and thermal actuator 31 may be rotated in a second direction that is generally opposite to the first direction when viewed from the same perspective to move vertically displaceable platform 12 above base 14. Thus, the tilt of frame 16 may be substantially equal to the tilt of vertically displaceable platform 12. Movement of vertically displaceable platform 12 in this manner enables vertically displaceable platform 12 to remain substantially parallel to base 14 though displaced along the z-axis.

The height at which vertically displaceable platform 12 may be raised above base 14 may be calculated as follows. A height H, as shown in FIG. 2, is equal to L multiplied by 2 sin θ, where L represents a length L of frame 16 and θ is the tilt angle of frame 16. For example, if L equals 1.5 millimeters (mm) and θ is about 10 degrees, then vertically displaceable platform 12 is suspended about 260 μm above base 14. In other words, if thermal actuators 30 and 31 both rotate 10 degrees, vertically displaceable platform 12 will travel vertically along the Z-axis 260 μm. In yet another example, if L equals 2 mm and θ equals 30 degrees, vertically displaceable platform 12 may be moved about 1.0 mm along the Z axis. The height through which vertically displaceable platform 12 may move relative to base 14 may vary depending on the length L of frame 16 and angle θ.

In a fourth mode, thermal actuators 31 need not move vertically displaceable platform 12 at an angle θ1 relative to frame 16 that is equal to an angle θ between frame 16 and base 14. Instead, angle θ1 may have values other than the values for angle θ. In other words, the tilt of vertically displaceable platform 12 relative to frame 16 may be different than the tilt of frame 16 relative to base 14. This allows vertically displaceable platform to be moved vertically along a Z-axis relative to base 14, yet be positioned in planes not parallel to base 14.

In a fifth mode, vertical displacement device 10, as shown in FIG. 15, may be used to perform 2-D scanning. A current may be applied to thermal actuators 58 and 60 to move vertically displaceable platform 12 along the Z-axis in a position that is substantially parallel to base 14 and orthogonal to the Z-axis. Thermal actuators 62 and 64 may be actuated when vertically displaceable platform 12 is at various positions along the Z-axis to perform 2-D scanning at each position of the vertically displaceable platform 12 along the Z-axis. This enables 2-D laser scanning to be achieved.

In one embodiment, the thermal actuators 30, 31, 58, 60, 62, or 64 in any of the embodiments shown in the figures may be formed from different materials enabling the thermal actuators to bend at different amounts while receiving the same amount of electrical current. Thus, the thermal actuators 30, 31, 58, 60, 62, or 64 may be used in many different applications where different amounts of movement are necessary.

Figure 16:
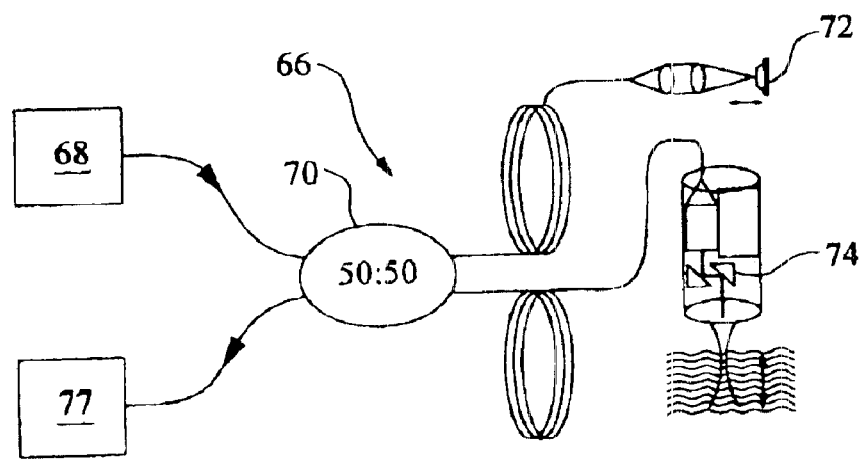
FIG. 16 is a schematic diagram of an OCT system including a vertical displacement device for axial scanning and a vertical displacement device for transverse scanning.
Figure 17:
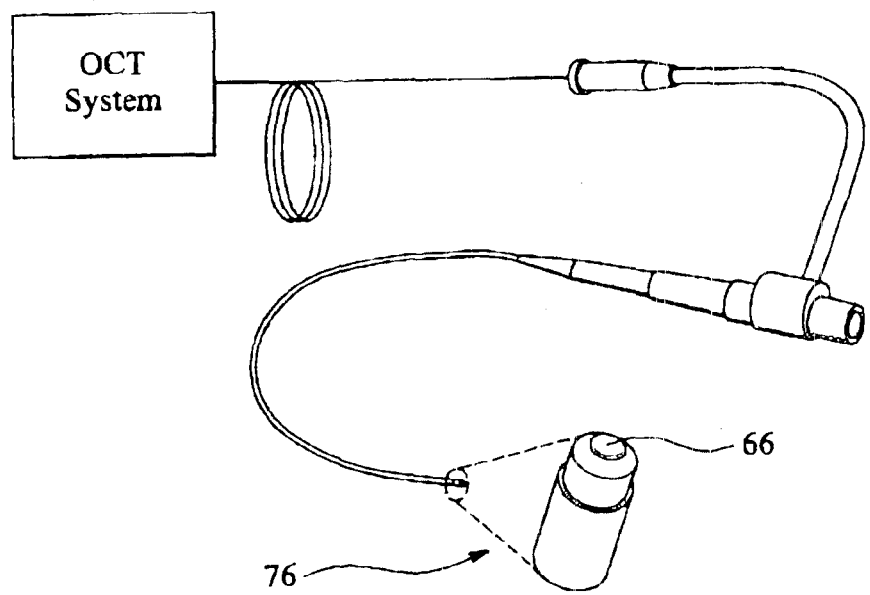
FIG. 17 is a schematic diagram displaying a vertical displacement device enabled miniature OCT system installed in a working channel of a bronchoscope.

Vertical displacement device 10 may be used in a variety of situations. For example, vertical displacement device 10 may be used with optical coherence tomography (OCT), as shown in FIG. 16. Vertical displacement device 10 may be included as a part of a MEMS based OCT system 66. MEMS based OCT system 66 may include one or more broadband sources 68 coupled to a beam splitter 70. MEMS based OCT system 66 may include a 1-D vertically scanning micromirror 72 for axial reference scanning coupled to beam splitter 70, and a 1-D or 2-D micromirror 74, otherwise referred to as a bidirectional rotating micromirror for transverse sample scanning coupled to the beam splitter 70. A photodetector 77 may used to detect interference light signals from reference MEMS micromirror 72 and sample scanning micromirror 74. Another application of the MEMS based OCT system is shown in FIG. 17, where an MEMS-OCT imaging probe 66 can be incorporated in bronchoscope 76 to be used for early lung cancer detection.

Figure 18:
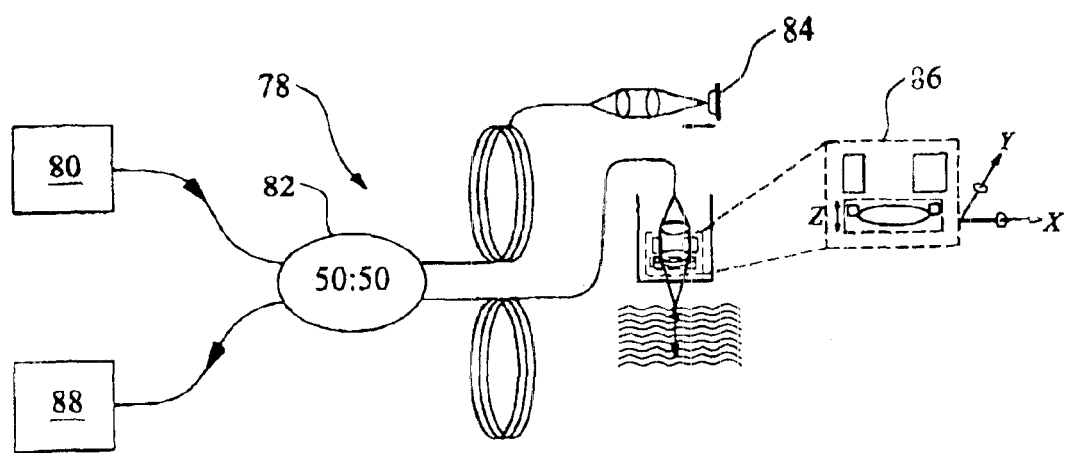
FIG. 18 is a schematic diagram of an OCM system including a vertical displacement device for axial scanning and another vertical displacement device with a microlens for focal point tuning and transverse image scanning.

In another example, as shown in FIG. 18, vertical displacement device 10 may be used in a MEMS based optical coherence microscopy (OCM) system 78. MEMS based OCM system 78 may include one or more broadband sources 80 coupled to a beam splitter 82. MEMS based OCM system 78 may include a reference scanning micromirror 74 coupled to beam splitter 82, and a sample scanning microlens 86 coupled to beam splitter 82. A photodetector 88 may be used to capture an optical signal. MEMS based OCM system 78 using reference MEMS micromirror 84 and scanning MEMS microlens 86 is significantly smaller than conventional systems and has increased imaging speed, as shown in FIG. 18. Reference MEMS micromirror 84 and scanning MEMS microlens 86 enable MEMS based OCM system 78 to be portable for field use and to form compact OCM probes for in vivo, minimally invasive 3-D imaging of internal organs.

The foregoing is provided for purposes of illustrating, explaining, and describing embodiments of this invention. Modifications and adaptations to these embodiments will be apparent to those skilled in the art and may be made without departing from the scope or spirit of this invention.

I claim:

1. A MEMS vertical displacement device, comprising:
   an anchor;
   at first frame rotatable about the anchor and having a first side and a second side opposing the first side;
   at least one first actuator coupled to the first side of the first frame and to the anchor enabling the first frame to rotate about the anchor;
   at least one vertically displaceable platform rotatable about the second side of the first frame; and
   at least one second actuator coupled to the second side of the first frame and to the at least one vertically displaceable platform enabling the at least one vertically displaceable platform to rotate about the second side of the first frame.

2. The MEMS vertical displacement device of claim 1, wherein the at least one first actuator is a thermal actuator.

3. The MEMS vertical displacement device of claim 2, wherein the at least one second actuator is a thermal actuator.

4. The MEMS vertical displacement device of claim 2, wherein the thermal actuator is formed from at least two layers of different material having different coefficients of thermal expansion.

5. The MEMS vertical displacement device of claim 4, further comprising a third material encapsulated in at least one of the materials that functions as a heating element.

6. The MEMS vertical displacement device of claim 1, further comprising at least one extension arm coupled to the first frame and to the vertical displacement device for increasing the amount of vertical displacement of the vertically displaceable platform.

7. The MEMS vertical displacement device of claim 1, wherein the vertically displaceable platform is a microlens.

8. The MEMS vertical displacement device of claim 1, wherein the vertically displaceable platform is a micromirror.

9. The MEMS vertical displacement device of claim 1, wherein the vertically displaceable platform is micro-grating.

10. The MEMS vertical displacement device of claim 1, further comprising a second frame rotatably coupled to the first frame using the at least one second actuator and a third frame coupled to the second frame using a third actuator, wherein the second frame fits inside the first frame and the third frame fits inside the second frame while the vertical displacement device is not actuated.

11. The MEMS vertical displacement device of claim 10, wherein the third frame is coupled to the second frame at a side generally orthogonal to the side to which the second frame is attached to the first frame.

12. The MEMS vertical displacement device of claim 11, wherein the vertically displaceable platform is coupled to a side of the third frame that is generally opposite to the side to which the third frame is attached to the second frame.

13. The MEMS vertical displacement device of claim 12, wherein the vertically displaceable platform is a microlens and is capable of being used to perform 2D scanning.

14. The MEMS vertical displacement device of claim 12, wherein the vertically displaceable platform is a micromirror and is capable of being used to perform 2D scanning.

15. The MEMS vertical displacement device of claim 12, wherein the vertically displaceable platform is micro-grating and is capable of being used to perform 2D scanning.

* * * * *